United States Patent
Chen et al.

(10) Patent No.: US 10,332,862 B2
(45) Date of Patent: Jun. 25, 2019

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Bo-Syun Chen, Kaohsiung (TW); Tang-Yuan Chen, Kaohsiung (TW); Yu-Chang Chen, Kaohsiung (TW); Jin-Feng Yang, Kaohsiung (TW); Chin-Li Kao, Kaohsiung (TW); Meng-Kai Shih, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/698,451

(22) Filed: Sep. 7, 2017

(65) Prior Publication Data

US 2019/0074264 A1    Mar. 7, 2019

(51) Int. Cl.
*H01L 25/00* (2006.01)
*H01L 25/065* (2006.01)

(52) U.S. Cl.
CPC .......... *H01L 25/0657* (2013.01); *H01L 25/50* (2013.01); *H01L 2225/0652* (2013.01); *H01L 2225/06517* (2013.01); *H01L 2225/06537* (2013.01); *H01L 2225/06558* (2013.01); *H01L 2225/06572* (2013.01); *H01L 2225/06582* (2013.01); *H01L 2225/06589* (2013.01)

(58) Field of Classification Search
CPC ................................................... H01L 25/0657
See application file for complete search history.

(56) References Cited

U.S. PATENT DOCUMENTS

| 8,901,718 | B2 | 12/2014 | Cho | |
|---|---|---|---|---|
| 9,545,026 | B2 | 1/2017 | Fukuda et al. | |
| 2011/0210444 | A1* | 9/2011 | Jeng | H01L 23/13 257/738 |
| 2014/0217610 | A1* | 8/2014 | Jeng | H01L 23/3128 257/774 |

* cited by examiner

*Primary Examiner* — William A Harriston
(74) *Attorney, Agent, or Firm* — Foley & Lardner LLP; Cliff Z. Liu

(57) ABSTRACT

A semiconductor package structure includes a first substrate, at least one first semiconductor element and a second substrate. The first semiconductor element is attached to the first substrate. The second substrate defines a cavity and includes a plurality of thermal vias. One end of each of the thermal vias is exposed in the cavity, and the first semiconductor element is disposed within the cavity and thermally connected to the thermal vias.

30 Claims, 15 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure and a packaging method, and more particularly, to a semiconductor package structure including a cavity substrate with thermal vias and a method for manufacturing the semiconductor package structure.

2. Description of the Related Art

A specification of a semiconductor package structure may include a high-speed data transmission capability, a high data capacity and a small footprint. Heat dissipation is also an issue for such a semiconductor package structure. During operation, high-speed data transmission can result in a significant amount of heat being generated and can raise a temperature of the semiconductor package structure. Due to the small size of the semiconductor package structure, it can be difficult to dissipate the heat. If the heat is not dissipated efficiently, the performance of the semiconductor package structure can be decreased, or the semiconductor package structure may break down or be rendered inoperative.

SUMMARY

In some aspects according to some embodiments, a semiconductor package structure includes a first substrate, at least one first semiconductor element and a second substrate. The first semiconductor element is attached to the first substrate. The second substrate defines a cavity and includes a plurality of thermal vias. One end of each of the thermal vias is exposed in the cavity, and the first semiconductor element is disposed within the cavity and contacts the thermal vias.

In some aspects according to some embodiments, a semiconductor package structure includes a first substrate, at least one first semiconductor element, a second substrate and a thermal conductive material. The first semiconductor element is attached to the first substrate. The second substrate defines a cavity and includes a plurality of thermal vias. One end of each of the thermal vias is exposed in the cavity, and the first semiconductor element is disposed within the cavity. The thermal conductive material is interposed between the first semiconductor element and the thermal vias.

In some aspects according to some embodiments, a semiconductor package structure includes a first substrate, at least one first semiconductor element, a second substrate, a plurality of first electrical connectors and a first encapsulant. The first semiconductor element is attached to the first substrate. The second substrate defines a cavity and includes a plurality of thermal vias. One end of each of the thermal vias is exposed in the cavity. The first semiconductor element is disposed within the cavity and is thermally connected to the thermal vias. The first electrical connectors are disposed between the first substrate and the second substrate for electrically connecting the first substrate and the second substrate. The first encapsulant fills a gap between the first substrate and the second substrate and covers the first electrical connectors.

In some aspects according to some embodiments, a method for manufacturing a semiconductor package structure includes: (a) attaching at least one first semiconductor element to a first substrate; (b) providing a second substrate defining a cavity and including a plurality of thermal vias, wherein one end of each of the thermal vias is exposed in the cavity; (c) bonding the first substrate and the second substrate, wherein the first semiconductor element is disposed within the cavity and is thermally connected to the thermal vias; and (d) forming a first encapsulant to fill a gap between the first substrate and the second substrate.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
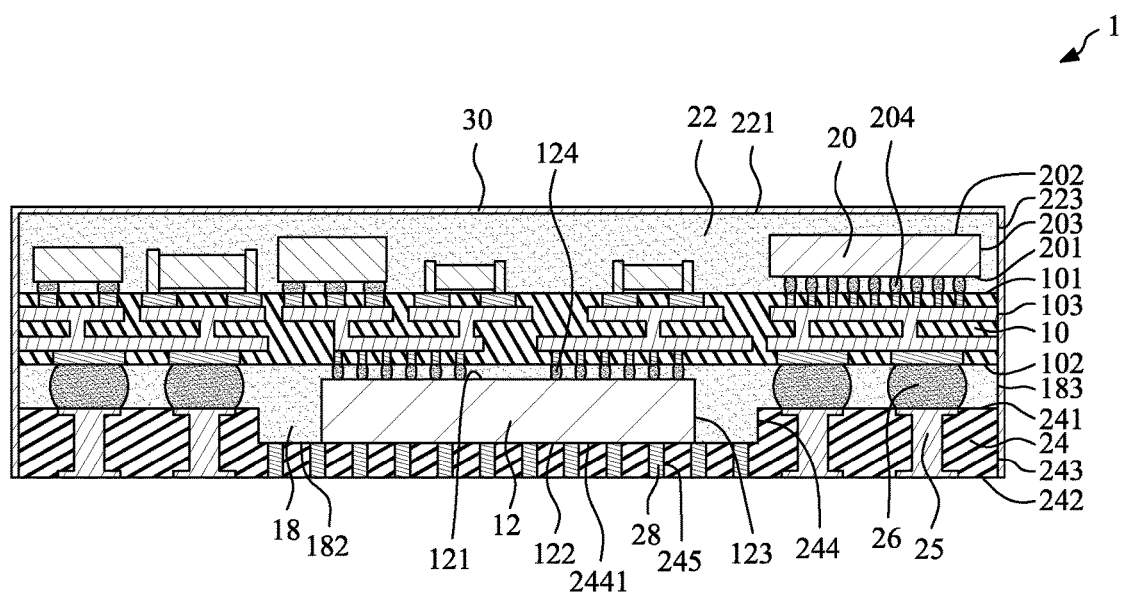
FIG. 1 illustrates a cross-sectional view of some embodiments of a semiconductor package structure according to an aspect of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a first comparative example of semiconductor package structure, a plurality of semiconductor elements (e.g., semiconductor dice and/or passive elements) are attached to one side of a package substrate, and an encapsulant is formed on the package substrate to cover the semiconductor elements. A size of the package substrate of the semiconductor package structure may be, e.g., about 11.7 millimeters (mm)× about 8.9 mm. A thermal resistance $\theta_{JA}$ of the semiconductor package structure is defined as $(T_J-T_A)/P$, where $T_J$ is a junction temperature between the semiconductor die and the package substrate, $T_A$ is the ambient temperature and P is a power dissipation of the semiconductor package structure. The thermal conditions of the first example of semiconductor package structure are, e.g.: $T_J$ is about 79.3 degrees Celsius (° C.), $T_A$ is about 25° C., P is about 3.76 W, and $\theta_{JA}$ is about 14.44° C./W.

In order to reduce the size of the package substrate, a second comparative example of semiconductor package structure with double side molding is provided. In the second comparative example of semiconductor package structure, some of the semiconductor elements (e.g., top semiconductor elements) are disposed on a top side of the package substrate, and the other semiconductor element(s) (e.g., bottom semiconductor element(s)) and a plurality of solder balls are disposed on a bottom side of the package substrate. A top encapsulant is formed on the top side of the package substrate to cover the top semiconductor elements, and a bottom encapsulant is formed on the bottom side of the package substrate to cover the bottom semiconductor element(s) and expose at least a portion of each of the solder balls. Thus, the size of the package substrate of the second example can be reduced to, e.g., about 9 mm×about 8.6 mm. However, the thermal conditions of the second comparative example of semiconductor package structure are, e.g.: $T_J$ is about 102.6° C., $T_A$ is about 25° C., P is about 3.76 W, and $\theta_{JA}$ is about 20.63° C./W. Thus, the thermal resistance of the second comparative example is increased as compared with the first comparative example.

In a third comparative example of semiconductor package structure, the solder balls with a thermal conductivity of, e.g., 67 W/mK of the second comparative example may be replaced by a plurality of copper core balls with a thermal conductivity of, e.g., about 104 W/mK. The thermal conditions of the third comparative example are, e.g.: $T_J$ is about 133.6° C., $T_A$ is about 75° C., P is about 3.23 W, and $\theta_{JA}$ is about 18.14° C./W.

In order to further reduce the size of the package substrate, the copper core balls of the third comparative example may be replaced by an interposer and a plurality of solder balls so as to form a fourth comparative example of semiconductor package structure. In the fourth comparative example of semiconductor package structure, the interposer defines at least one through hole to accommodate the bottom semiconductor element(s) and the bottom encapsulant, and the size of the package substrate can be reduced to, e.g., about 9 mm×about 8 mm. The thermal conditions of the fourth comparative example are, e.g.: $T_J$ is about 134.8° C., $T_A$ is about 75° C., P is about 3.23 W, and $\theta_{JA}$ is about 18.51° C./W. Therefore, the thermal resistance of the fourth comparative example is increased as compared with the third example.

In a fifth comparative example of semiconductor package structure, an underfill with a thermal conductivity of, e.g., about 0.5 W/mK is disposed on a bottom surface of the interposer and a bottom surface of the bottom encapsulant. The thermal conditions of the fifth example are, e.g.: $T_J$ is about 127° C., $T_A$ is about 75° C., P is about 3.23 W, and $\theta_{JA}$ is about 16.10° C./W. Therefore, the thermal resistance of the fifth comparative example has an improvement of, e.g., about 11% as compared with the thermal resistance of the third thermal resistance example. As disclosed above, the efficiencies of such heat dissipation techniques of these above-mentioned comparative examples are limited at least partially because the bottom semiconductor element(s) is covered by the bottom encapsulant.

To address at least the above concerns, the present disclosure describes an improved semiconductor package structure according to at least some embodiments. The semiconductor package structure includes a cavity substrate including a plurality of thermal vias. One end of each of the thermal vias is exposed in the cavity. The bottom semiconductor element(s) is located within the cavity and thermally connected to the thermal vias. Thus, the heat can be dissipated from the bottom semiconductor element(s) through the thermal vias. Furthermore, the thermal vias can be thermally connected to a printed circuit board (PCB) through a thermal connector having a high thermal conductivity. Such configuration may dissipate the heat generated by the bottom semiconductor element(s) through the PCB efficiently. Thus, highly efficient heat dissipation can be achieved.

FIG. 1 illustrates a cross-sectional view of some embodiments of a semiconductor package structure 1 according to an aspect of the present disclosure. The semiconductor package structure 1 may be a semiconductor package structure with double side molding, and includes, but not limited to, a first substrate 10, at least one first semiconductor element 12, a second substrate 24, a plurality of first electrical connectors 26, a first encapsulant 18, at least one second semiconductor element 20 and a second encapsulant 22.

The first substrate 10 can be a package substrate, and can have a first surface 101, a second surface 102 and a periphery surface 103. The second surface 102 is opposite to the first surface 101, and the periphery surface 103 extends between the first surface 101 and the second surface 102. The material of the first substrate 10 may be organic or inorganic. For example, the material of the first substrate 10 may include a glass-reinforced epoxy resin material (e.g., FR4 grade glass-reinforced epoxy resin), bismaleimide triazine (BT), epoxy, silicon, PCB material, glass, ceramic, or a combination of two or more thereof.

The first semiconductor element 12 is attached to and electrically connected to the second surface 102 of the first substrate 10. In some embodiments, the first semiconductor element 12 may include at least one semiconductor die (e.g., a Wi-Fi module) and/or at least one passive element. The first semiconductor element 12 has a first surface 121 (e.g., an active surface), a second surface 122 (e.g., a back side surface) and a side surface 123. The second surface 122 is opposite to the first surface 121, and the side surface 123 extends between the first surface 121 and the second surface 122. The first surface 121 of the first semiconductor element 12 faces the second surface 102 of the first substrate 10, and is electrically connected to the second surface 102 of the substrate 10 through a plurality of first interconnection elements 124, such as bumps or pillars or both. For example, the first semiconductor element 12 may be attached to the second surface 102 of the first substrate 10 by, e.g., flip chip bonding.

The second substrate 24 has a first surface 241, a second surface 242 and a periphery surface 243, and defines at least one cavity 244. The second surface 242 is opposite to the first surface 241, and the periphery surface 243 extends between the first surface 241 and the second surface 242. In some embodiments, the cavity 244 may not extend through the second substrate 24. That is, the second substrate 24 is a cavity substrate. However, in some other embodiments, the second substrate 24 may be an interposer. The material of the second substrate 24 may be an organic material, an inorganic material, or a combination thereof. For example, the material of the second substrate 24 may include a glass-reinforced epoxy resin material (e.g., FR4), BT, epoxy, silicon, PCB material, glass, ceramic, or a combination of two or more thereof.

The first surface 241 of the second substrate 24 and the cavity 244 of the second substrate 24 faces the second surface 102 of the first substrate 10. As shown in FIG. 1, the first surface 241 of the second substrate 24 is attached to and electrically connected to the second surface 102 of the first substrate 10 through the first electrical connectors 26. The cavity 244 may be used for accommodating the first semiconductor element 12. That is, the first semiconductor element 12 is located within the cavity 244 of the second substrate 24. In some embodiments, a depth of the cavity 244 may be, e.g., about ⅔, about ½ or about ⅓ of a maximum thickness of the second substrate 24. The cavity 244 has a bottom surface 2441.

In addition, the second substrate 24 includes a plurality of conductive vias 25 and a plurality of thermal vias 28. The conductive vias 25 may extend through the second substrate 24 and are disposed around the cavity 244. A top end of each of the conductive vias 25 is disposed adjacent to or exposed from the first surface 241 of the second substrate 24, whereas a bottom end of each of the conductive vias 25 is disposed adjacent to or exposed from the second surface 242 of the second substrate 24. The material of the conductive vias 25 may be, e.g., copper or another metal or metal alloy. The conductive vias 25 may be used as electrical connection paths; however, the conductive vias 25 can be used, alternatively or additionally, as heat dissipation paths.

The thermal vias 28 may extend through the second substrate 24 and are disposed corresponding to (e.g., under) the cavity 244. In some embodiments, the thermal vias 28 are disposed in through holes 245 that are defined by the second substrate 24 and in communication with the cavity 244. A top end of each of the thermal vias 28 is disposed adjacent to or exposed in the cavity 244 (e.g., exposed from a bottom surface 2441 of the cavity 244 as shown in FIG. 1), whereas a bottom end of each of the thermal vias 28 is disposed adjacent to or exposed from the second surface 242 of the second substrate 24. The material of the thermal vias 28 may be metal (e.g., copper) or metal alloy. A length of each of the thermal vias 28 is less than a length of each of the conductive vias 25. The thermal vias 28 may be used as heat dissipation paths; however, the thermal vias 28 can be used, alternatively or additionally, as electrical connection paths.

The first electrical connectors 26 are disposed between the first surface 241 of the second substrate 24 and the second surface 102 of the first substrate 10. That is, the first electrical connectors 26 physically contact the first surface 241 of the second substrate 24 and the second surface 102 of the first substrate 10 so as to electrically connect the second substrate 24 to the first substrate 10. The first electrical connectors 26 may be, e.g., solder balls, and may be connected to the top ends of respective ones of the conductive vias 25. Thus, as shown in FIG. 1, a sum of a height of the first interconnection element 124, a thickness of the first semiconductor element 12 and a length of the thermal via 28 is substantially equal to a sum of a height of the first electrical connector 26 and a maximum thickness of the second substrate 24 (which is substantially equal to the length of the conductive via 25).

The first encapsulant 18 fills a gap between the second surface 102 of the first substrate 10 and the first surface 241 of the second substrate 24, and extends into and fills the cavity 244 of the second substrate 24. Thus, the first encapsulant 18 covers the side surface 123 of the first semiconductor element 12, and further covers the electrical connectors 26. The material of the first encapsulant 18 may be, e.g., a molding compound. The first encapsulant 18 has a second surface 182 and a periphery surface 183. The second surface 182 of the first encapsulant 18 is substantially coplanar with the second surface 122 of the first semiconductor element 12. The periphery surface 183 of the first encapsulant 18 may be substantially coplanar with the periphery surface 103 of the first substrate 10 and the periphery surface 243 of the second substrate 24. In addition, at least a portion of the first encapsulant 18 may surround and protect the first interconnection elements 124 (e.g., a molded underfill (MUF)). In some embodiments, there may be an underfill disposed in the space between the first semiconductor element 12 and the second surface 102 of the first substrate 10 to surround and protect the first interconnection elements 124.

The second semiconductor element 20 is attached to and electrically connected to the first surface 101 of the first substrate 10. In some embodiments, the second semiconductor element 20 may include at least one semiconductor die (e.g., a Wi-Fi module) and/or at least one passive element. The second semiconductor element 20 has a first surface 201 (e.g., an active surface), a second surface 202 (e.g., a back side surface) and a side surface 203. The second surface 202 is opposite to the first surface 201, and the side surface 203 extends between the first surface 201 and the second surface 202. The first surface 201 of the second semiconductor element 20 faces the first surface 101 of the first substrate 10, and is electrically connected to the first surface 101 of the first substrate 10 through a plurality of second interconnection elements 204, such as bumps or pillars or both. For example, the second semiconductor element 20 may be attached to the first surface 101 of the first substrate 10 by, e.g., flip chip bonding.

The second encapsulant 22 is disposed on the first surface 101 of the first substrate 10 to cover the second semiconductor element 20. The material of the second encapsulant 22 may be, e.g., a molding compound. The second encapsulant 22 has a first surface 221 and a periphery surface 223. The first surface 221 of the second encapsulant 22 is higher than the second surface 202 of the second semiconductor element 20. In some embodiments, the first surface 221 of the second encapsulant 22 may be substantially coplanar with the second surface 202 of the second semiconductor element 20. For example, the second semiconductor element 20 may be exposed from the second encapsulant 22. Further, the periphery surface 223 of the second encapsulant 22 may be substantially coplanar with the periphery surface 103 of the first substrate 10. In addition, at least a portion of the second encapsulant 22 may further extend into the space between the second semiconductor element 20 and the first surface 101 of the first substrate 10 to surround and protect the second interconnection elements 204 (e.g., a MUF). In some embodiments, there may be an underfill disposed in the space between the second semiconductor element 20 and the first surface 101 of the first substrate 10 to surround and protect the second interconnection elements 204.

In one embodiment, the semiconductor package structure 1 may further include a shielding layer 30 disposed on the first surface 221 and the periphery surface 223 of the second encapsulant 22, the periphery surface 103 of the first substrate 10, the periphery surface 183 of the first encapsulant 18 and the periphery surface 243 of the second substrate 24. The shielding layer 30 may include at least one metal layer so as to shield the electromagnetic noise of the ambient atmosphere from entering the semiconductor package structure 1.

In the embodiment illustrated in FIG. 1, the second surface 122 of the first semiconductor element 12 contacts the bottom surface 2441 of the cavity 244. That is, the second surface 122 of the first semiconductor element 12 contacts the top ends of the thermal vias 28 directly. Thus, the heat generated in the semiconductor package structure 1 (e.g., the heat generated by the first semiconductor element 12) can be dissipated outside the semiconductor package structure 1 through the thermal vias 28 efficiently. In one embodiment, the material of the thermal vias 28 may, e.g., copper with a thermal conductivity of 401 W/mK. In some embodiments, the thermal conditions of such an embodiment are, e.g.: $T_J$ is about 110.0° C., $T_A$ is about 75° C., P is about 3.23 W, and $\theta_{JA}$ is about 10.84° C./W. That is, a thermal resistance of such an embodiment has an improvement of, e.g., about 40%, as compared with the thermal resistance of the above-mentioned third comparative example. Therefore, the heat dissipation technique of the present disclosure achieves an improved efficiency.

In addition, the first encapsulant 18 is formed by filling the space between the second surface 102 of the first substrate 10 and the first surface 241 of the second substrate 24 from a lateral side, after the second substrate 24 is attached to the first substrate 10. The first encapsulant 18 can enhance the bonding between the second substrate 24 and the first substrate 10, and prevent the elements (e.g., the first electrical connectors 26 and the first semiconductor element 12) disposed between the second substrate 24 and the first substrate 10 from swaying and displacement. Therefore, the semiconductor package structure 1 achieves an improved yield rate.

Figure 2:
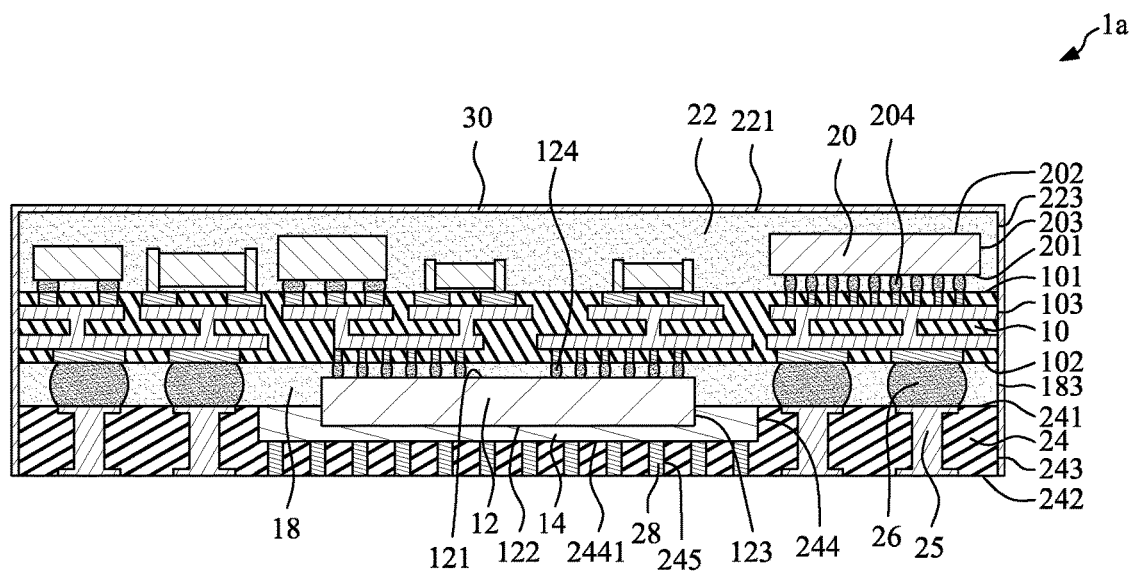
FIG. 2 illustrates a cross-sectional view of some embodiments of a semiconductor package structure according to an aspect of the present disclosure.

In some embodiments, a semiconductor package structure may further include a thermal conductive material disposed between a semiconductor element and thermal vias. FIG. 2 illustrates a cross-sectional view of some embodiments of a semiconductor package structure 1a according to an aspect of the present disclosure. The semiconductor package structure 1a of FIG. 2 is similar to the semiconductor package structure 1 as shown in FIG. 1, except that a thermal conductive material 14 is interposed between the first semiconductor element 12 and the thermal vias 28. As shown in FIG. 2, the thermal conductive material 14 is interposed between the second surface 122 of the first semiconductor element 12 and the bottom surface 2441 of the cavity 244. That is, the second surface 122 of the first semiconductor element 12 does not contact the top ends of the thermal vias 28 directly. The thermal conductive material 14 may be form by, e.g., curing from a paste, and may be used as a buffer layer.

In some embodiments, when there is no thermal conductive material 14 and a warpage occurs in the second substrate 24 or in other components of the semiconductor package structure 1a, the first semiconductor element 12 may crack due to being extruded by the thermal vias 28. That is, the thermal conductive material 14 can prevent the first semiconductor element 12 from cracking. In some embodiments, the thermal conductive material 14 may be, e.g., a thermal interface material (TIM) with a thermal conductivity of greater than or equal to about 3 W/mK, about 4 W/mK, or about 5 W/mK, and may include one or more copper fillers. Thus, the heat generated in the semiconductor package structure 1 (e.g., the heat generated by the first semiconductor element 12) can be dissipated to the thermal vias 28 through the thermal conductive material 14. In one embodiment, the thermal conductivity of the thermal conductive material 14 may be, e.g., about 3.8 W/mK. The thermal conditions of such an embodiment are, e.g.: $T_J$ is about 116.2° C., $T_A$ is about 75° C., P is about 3.23 W, and $\theta_{JA}$ is about 12.76° C./W. That is, a thermal resistance of such an embodiment has an improvement of about 30% as compared with the thermal resistance of above-mentioned third comparative example.

Figure 3:
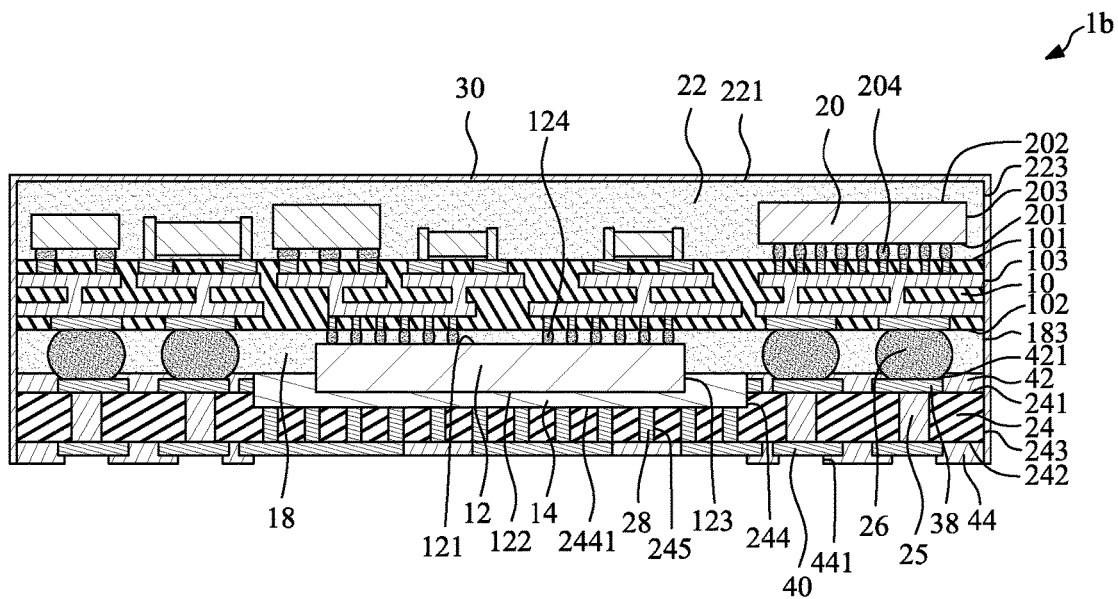
FIG. 3 illustrates a cross-sectional view of some embodiments of a semiconductor package structure according to an aspect of the present disclosure.

In some embodiments, a semiconductor package structure may further include one or more patterned circuit layers. FIG. 3 illustrates a cross-sectional view of some embodiments of a semiconductor package structure 1b according to an aspect of the present disclosure. The semiconductor package structure 1b of FIG. 3 is similar to the semiconductor package structure 1a as shown in FIG. 2, except that the second substrate 24 further includes a first patterned circuit layer 38, a second patterned circuit layer 40, a first protection layer 42 and a second protection layer 44. The first patterned circuit layer 38 is disposed on the first surface 241 of the second substrate 24, and is physically connected to and electrically connected to the top ends of the conductive vias 25. The first protection layer 42 may be, e.g., a solder resist layer, and is disposed on the first surface 241 of the second substrate 24 to cover the first patterned circuit layer 38. The first protection layer 42 defines a plurality of first openings 421 to expose at least portions of the first patterned circuit layer 38. The first electrical connectors 26 are physically connected to and electrically connected to the first patterned circuit layer 38 in the first openings 421 of the first protection layer 42.

The second patterned circuit layer 40 is disposed on the second surface 242 of the second substrate 24, and is physically connected to and electrically connected to the bottom ends of the conductive vias 25. The second protection layer 44 may be, e.g., a solder resist layer, and is disposed on the second surface 242 of the second substrate 24 to cover the second patterned circuit layer 40. The second protection layer 44 defines a plurality of second openings 441 to expose at least portions of the second patterned circuit layer 40 for, e.g., external connections. In some embodiments, the second patterned circuit layer 40 further connects at least one of the thermal vias 28.

Figure 4:
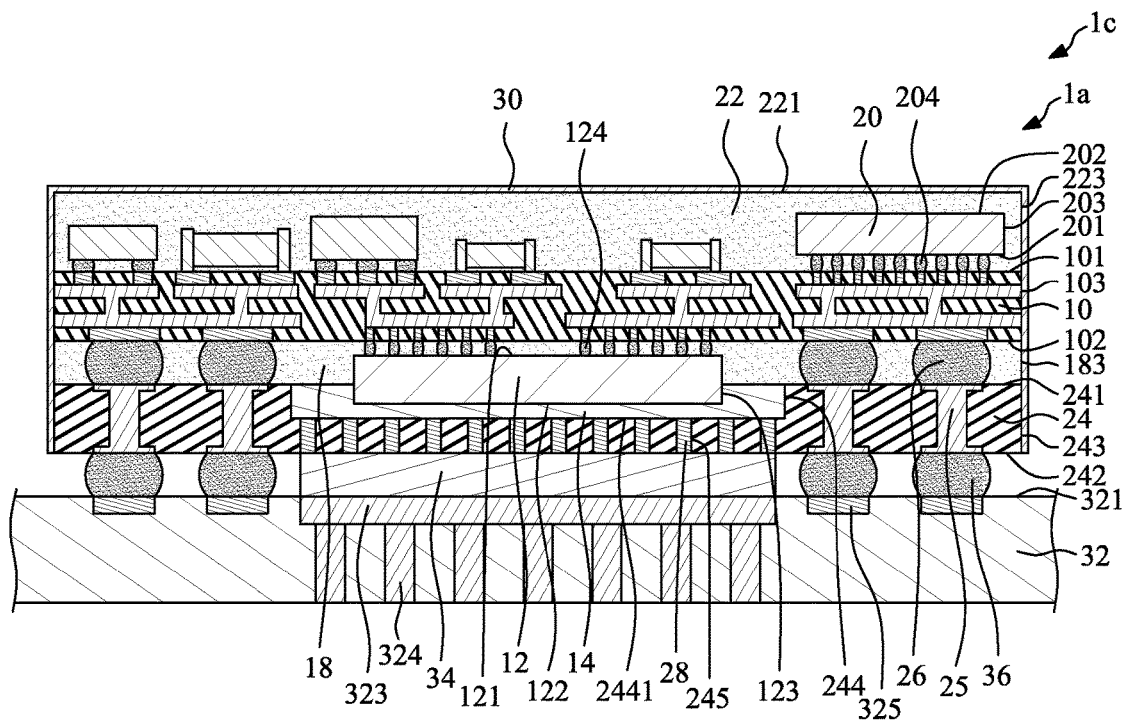
FIG. 4 illustrates a cross-sectional view of some embodiments of a semiconductor package structure mounted onto a circuit board according to an aspect of the present disclosure.

In some embodiments, a semiconductor package structure may be mounted onto a circuit board that includes heat dissipation components. FIG. 4 illustrates a cross-sectional view of some embodiments of a semiconductor package structure mounted onto a circuit board according to an aspect of the present disclosure. The semiconductor package structure 1c of FIG. 4 is similar to the semiconductor package structure 1a as shown in FIG. 2, except that the semiconductor package structure 1c of FIG. 4 further includes a circuit board 32 (e.g., PCB), and that the semiconductor package structure 1a is mounted onto the circuit board 32 by, for example, surface mount technology (SMT).

The circuit board 32 is disposed apart from the semiconductor package structure 1a, and has first surface 321, at least one first pad 323, a plurality of second pads 325 and a plurality of heat dissipation vias 324. The first pad 323 and the second pads 325 are exposed from the first surface 321 of the circuit board 32, and the heat dissipation vias 324 may extend through the circuit board 32. The first pad 323 may have no electrical function, and may be connected to the heat dissipation vias 324 in the circuit board 32. The second pad 325 may have electrical function, and may be connected to a circuit layer in the circuit board 32.

The semiconductor package structure 1c further includes a thermal connector 34 and a plurality of second electrical connectors 36. The thermal connector 34 may be, e.g., a solder paste, and is thermally and physically connected to at least one of the thermal vias 28 of the second substrate 24 and the first pad 323 of the circuit board 32. Thus, the second substrate 24 is thermally connected to the circuit board 32 through the thermal connector 34. A size of the thermal connector 34 may be substantially equal to a size of the first pad 323 of the circuit board 32. The second electrical connectors 36 may be, e.g., solder balls or solder posts, and are disposed between the second substrate 24 and the circuit board 32 for electrically and physically connecting the second substrate 24 and the second pads 325 of the circuit board 32.

Figure 5:
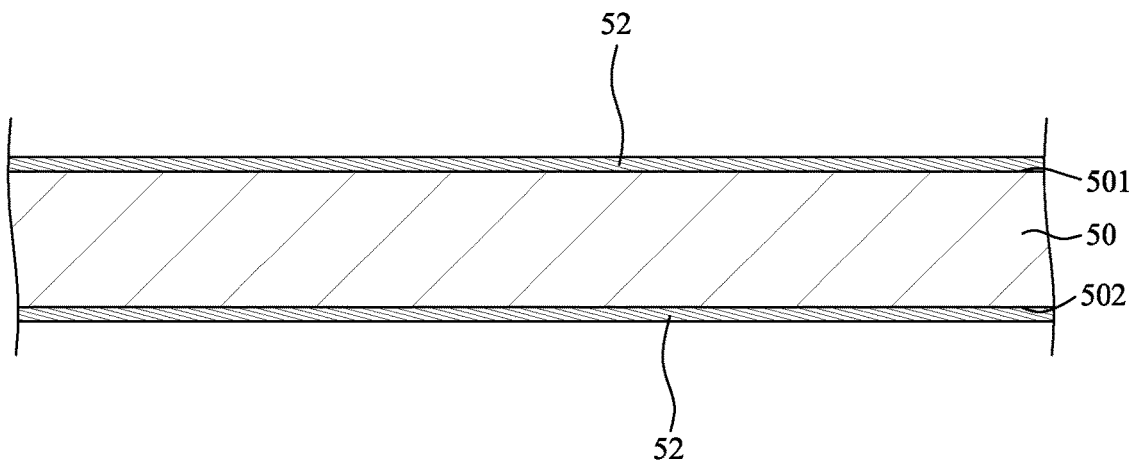
FIG. 5 illustrates one or more stages of an example of a method for manufacturing a semiconductor package structure according to some embodiments of the present disclosure.

FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25, FIG. 26, FIG. 27, FIG. 28 and FIG. 29 illustrate various stages of an example of a method for manufacturing a semiconductor package structure according to some embodiments of the present disclosure. In the illustrated embodiments, the method is used to manufacture semiconductor package structure such as the semiconductor package structure 1b shown in FIG. 3. Referring to FIG. 5, a carrier 50 is provided. A first metal layer 52 is formed on the carrier 50. The material of the first metal layer 52 may include, e.g., copper. The first metal layer 52 may be a seed layer. Alternatively, the first metal layer 52 may be a copper foil that is pressed against or adhered to the carrier 50. In some embodiments, as shown in FIG. 5, one or more substrates (including e.g., one or more metal layers 52) can be manufactured on both an upper surface 501 and a lower surface 502 of the carrier 50. For example, as shown in FIG. 5, the first metal layer 52 can be formed on both the upper surface 501 and the lower surface 502 of the carrier 50.

Figure 6:
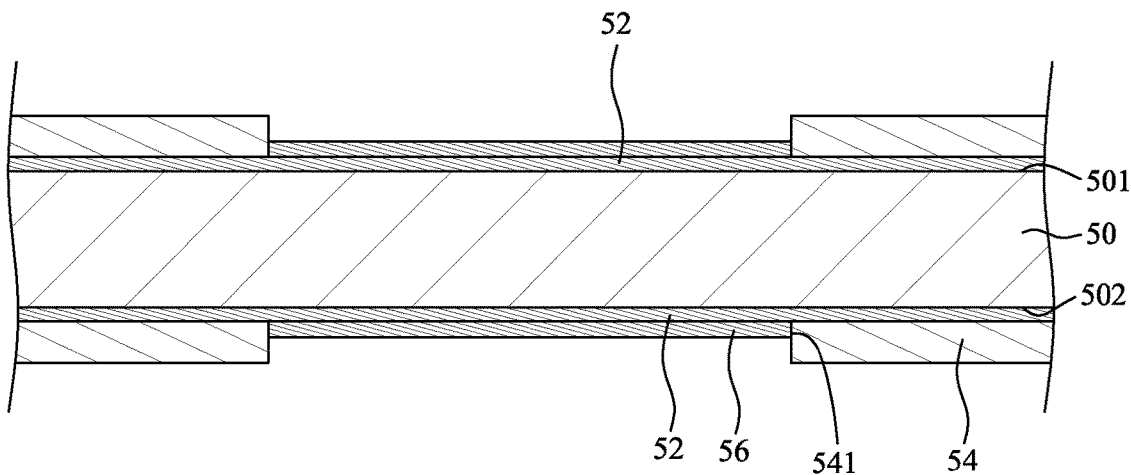
FIG. 6 illustrates one or more stages of an example of a method for manufacturing a semiconductor package structure according to some embodiments of the present disclosure.

Referring to FIG. 6, a photoresist layer 54 is formed on the first metal layer 52. The photoresist layer 54 may be applied in a dry-film form. The photoresist layer 54 defines at least one opening 541 to expose a portion of the first metal layer 52. It is noted that the location of the opening 541 of the photoresist layer 54 may correspond to the location of the cavity 244 of the second substrate 24 in FIG. 3. The photoresist layer 54 may be made of, e.g., a photo-imageable material, and the opening 541 may be patterned by a lithography technique. A conductive metal, such as copper, is formed on the first metal layer 52 in the opening 541 of the photoresist layer 54 by, for example, partially plating so as to form a protrusion portion 56 as shown in FIG. 6.

Figure 7:
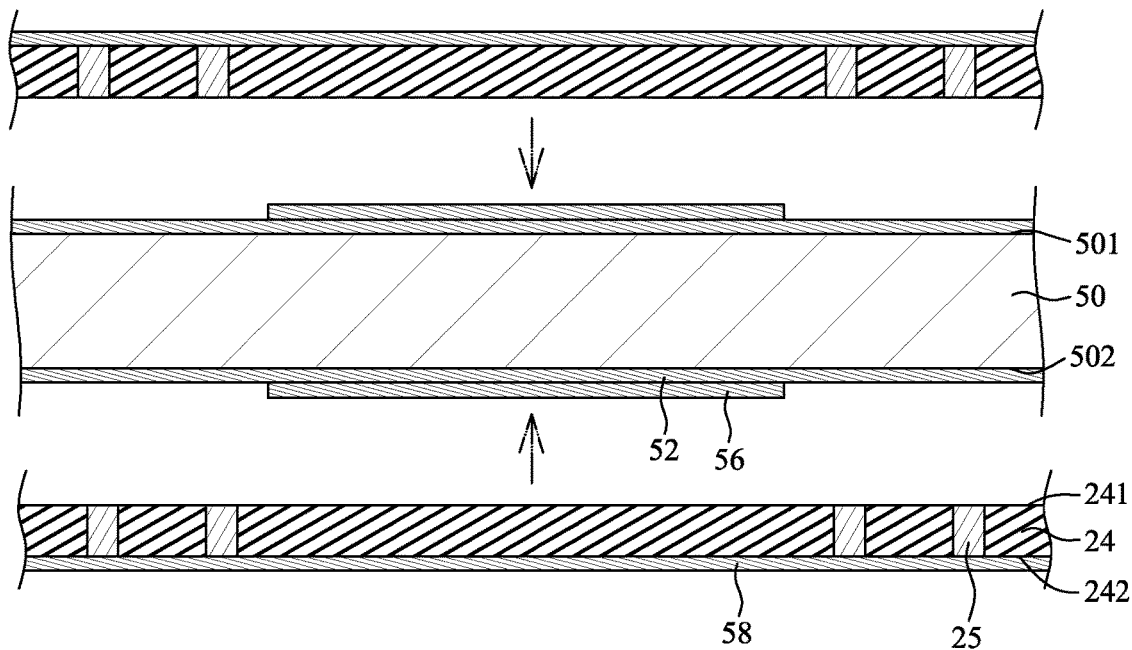
FIG. 7 illustrates one or more stages of an example of a method for manufacturing a semiconductor package structure according to some embodiments of the present disclosure.

Referring to FIG. 7, the photoresist layer 54 is removed by, for example, stripping. Then, a second substrate 24 is provided. The second substrate 24 can be, e.g., a strip type substrate structure or a panel type substrate structure. The second substrate 24 has a first surface 241 and a second surface 242 opposite to the first surface 241. The material of the second substrate 24 may be organic or inorganic. For example, the material of the second substrate 24 may include a glass-reinforced epoxy resin material (e.g., FR4), BT, epoxy, silicon, PCB material, glass, ceramic, or a combination of two or more thereof. In the stage of FIG. 7, the second substrate 24 may include a prepreg (e.g., a fibrous material preimpregnated with a resin).

In addition, the second substrate 24 includes a plurality of conductive vias 25 and a second metal layer 58. The conductive vias 25 may extend through the second substrate 24 and are disposed around the protrusion portion 56. A top end of each of the conductive vias 25 is disposed adjacent to or exposed from the first surface 241 of the second substrate 24, whereas a bottom end of each of the conductive vias 25 is disposed adjacent to or exposed from the second surface 242 of the second substrate 24. The material of the conductive vias 25 may be, e.g., copper. The conductive vias 25 may be used as electrical connection paths; however, the conductive vias 25 can be used, alternatively or additionally, as heat dissipation paths. The second metal layer 58 is formed on the second surface 242 of the second substrate 24. The material of the second metal layer 58 may include, e.g., copper. The second metal layer 58 may be a seed layer. Alternatively, the second metal layer 58 may be, e.g., a copper foil that is pressed on or adhered to the second substrate 24.

Figure 8:
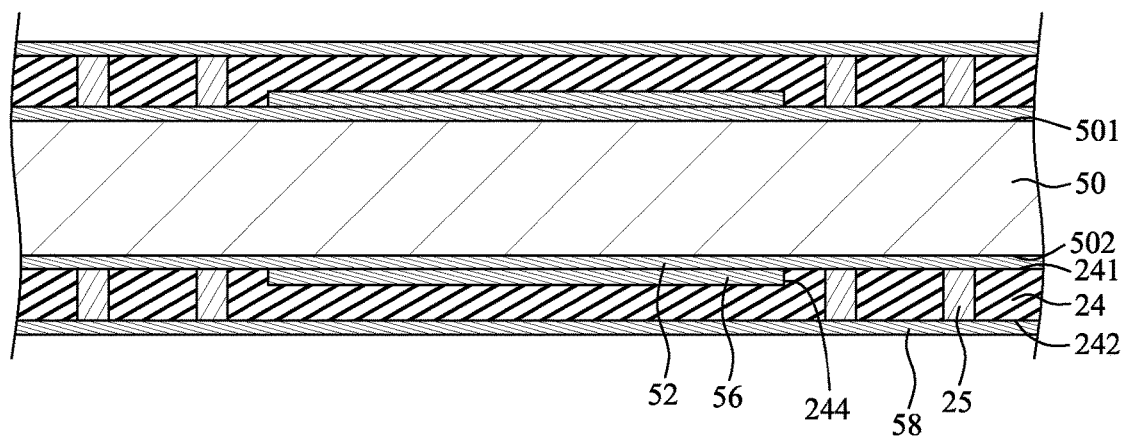
FIG. 8 illustrates one or more stages of an example of a method for manufacturing a semiconductor package structure according to some embodiments of the present disclosure.

Referring to FIG. 8, the second substrate 24 is pressed against the protrusion portion 56 on the carrier 50 so that the second substrate 24 defines a cavity 244 corresponding to the protrusion portion 56. As shown in FIG. 8, the first surface 241 of the second substrate 24 is attached to the first metal layer 52.

Figure 9:
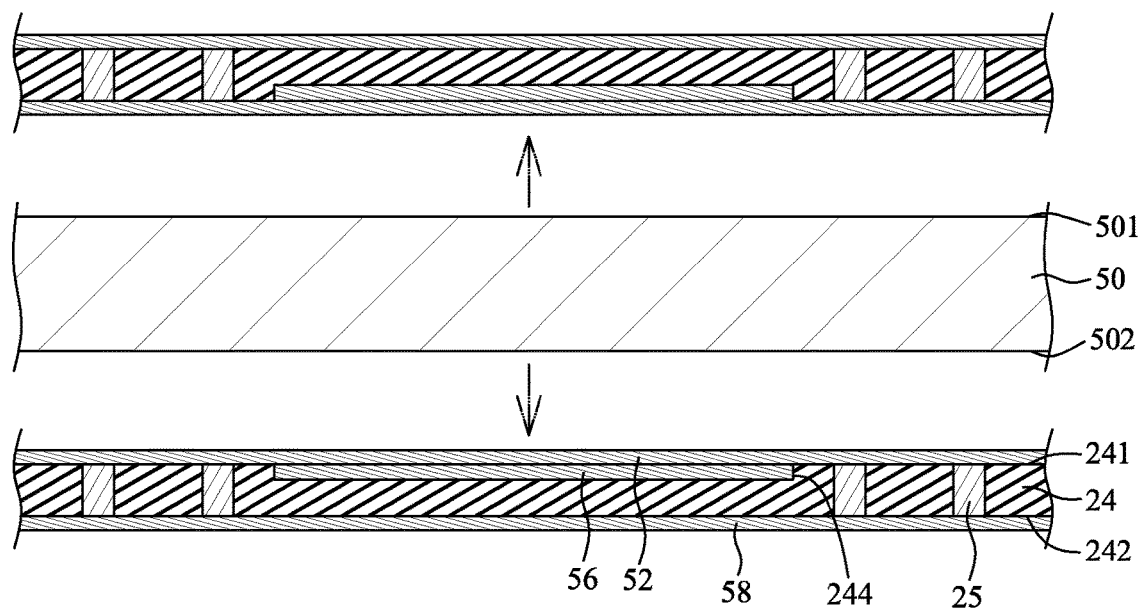
FIG. 9 illustrates one or more stages of an example of a method for manufacturing a semiconductor package structure according to some embodiments of the present disclosure.

Referring to FIG. 9, the carrier 50 is removed from the first metal layer 52. Thus, the second substrate 24 is separated from the carrier 50. As shown in FIG. 9, the first metal layer 52 remains disposed on the first surface 241 of the second substrate 24 after the separation.

Figure 10:
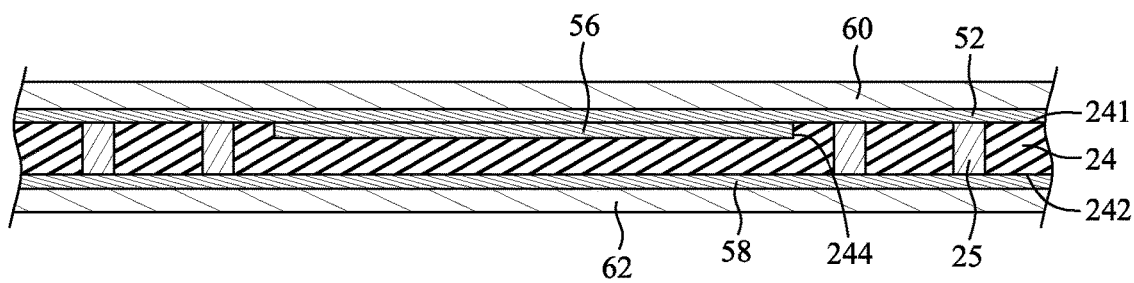
FIG. 10 illustrates one or more stages of an example of a method for manufacturing a semiconductor package structure according to some embodiments of the present disclosure.

Referring to FIG. 10, a first photoresist layer 60 and a second photoresist layer 62 are formed to cover the first metal layer 52 and the second metal layer 58 of the second substrate 24, respectively by, for example, coating. The first photoresist layer 60 and the second photoresist layer 62 may be made of, e.g., a photo-imageable material.

Figure 11:
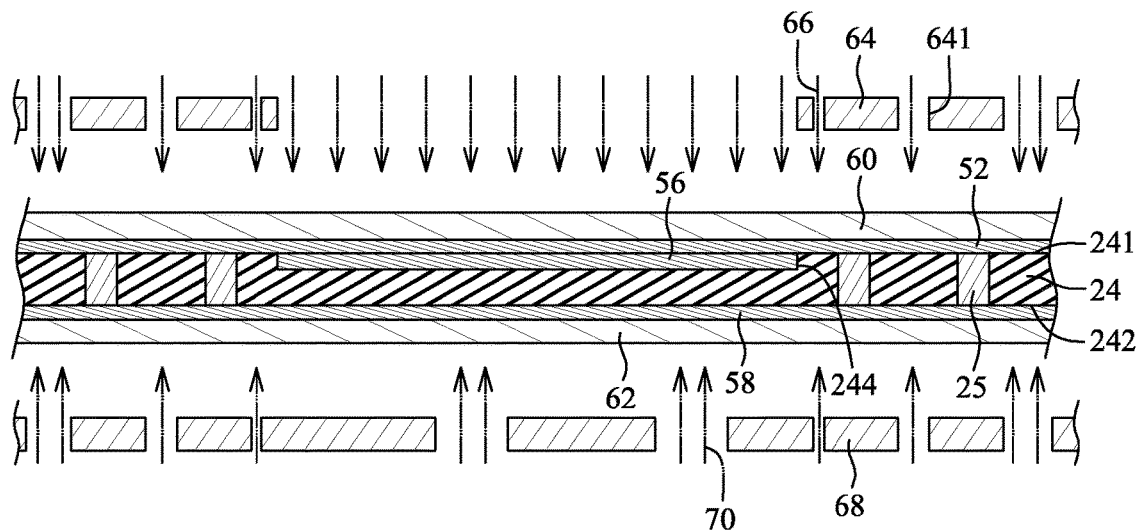
FIG. 11 illustrates one or more stages of an example of a method for manufacturing a semiconductor package structure according to some embodiments of the present disclosure.

Referring to FIG. 11, a first photomask 64 is applied above the first photoresist layer 60. The first photomask 64 defines at least one through hole 641 which extends through the first photomask 64. Light beams 66 emitted from a radiation source (e.g., ultraviolet (UV) source) are applied to the first photoresist layer 60 through the through hole 641 of the first photomask 64. That is, a portion of the first photoresist layer 60 corresponding to (e.g., under) the through hole 641 of the first photomask 64 is radiated by the light beams 66. The exposed portion of the first photoresist layer 60 becomes dissolvable to a developer (e.g., an organic solvent). The other portion of the first photoresist layer 60 corresponding to (e.g., under) the solid portion of the first photomask 64 is not radiated by the light beams 66. The unexposed portion is insoluble in the developer. It is noted that a similar exposure process may be conducted to the second photoresist layer 62 by using a second photomask 68 and light beams 70.

Figure 12:
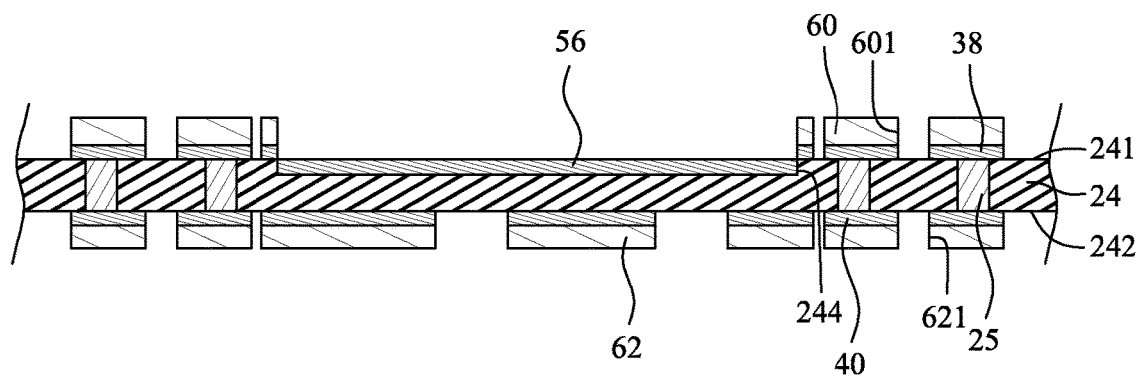
FIG. 12 illustrates one or more stages of an example of a method for manufacturing a semiconductor package structure according to some embodiments of the present disclosure.

Referring to FIG. 12, the first photomask 64 and the second photomask 68 are removed. A development process is conducted by applying a developer to the first photoresist layer 60 and the second photoresist layer 62 so as to dissolve and remove the exposed portion of the first photoresist layer 60 and the second photoresist layer 62. Thus, at least one through hole 601 that extends through the first photoresist layer 60 and at least one through hole 621 that extends through the second photoresist layer 62 are formed. A surface flashing etching process is performed on the first metal layer 52 and the second metal layer 58, with the first photoresist layer 60 and the second photoresist layer 62 serving as masks. After the surface flashing etching process, the first metal layer 52 forms a first patterned circuit layer 38, and the second metal layer 58 forms a second patterned circuit layer 40. The first patterned circuit layer 38 is physically connected to and electrically connected to the top ends of the conductive vias 25, and the second patterned circuit layer 40 is physically connected to and electrically connected to the bottom ends of the conductive vias 25. It is noted that the portion of the first metal layer 52 that is disposed on the protrusion portion 56 is also etched away, and the protrusion portion 56 remains and is exposed.

Figure 13:
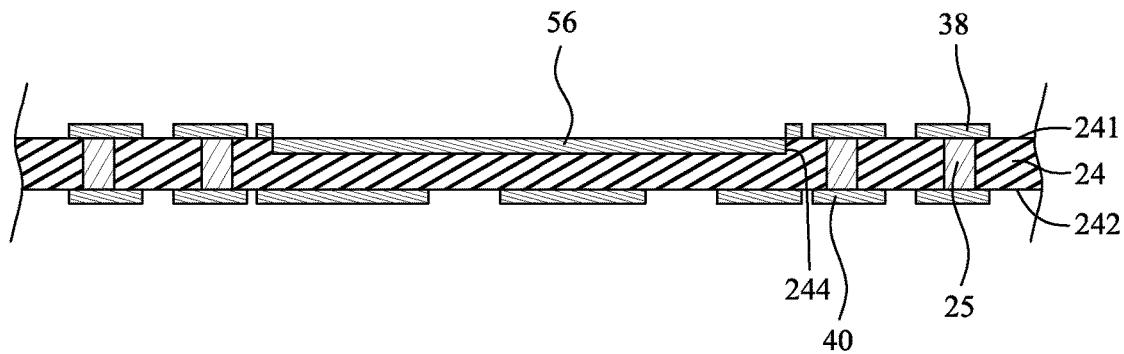
FIG. 13 illustrates one or more stages of an example of a method for manufacturing a semiconductor package structure according to some embodiments of the present disclosure.

Referring to FIG. 13, the first photoresist layer 60 and the second photoresist layer 62 are removed by, for example, stripping.

Figure 14:
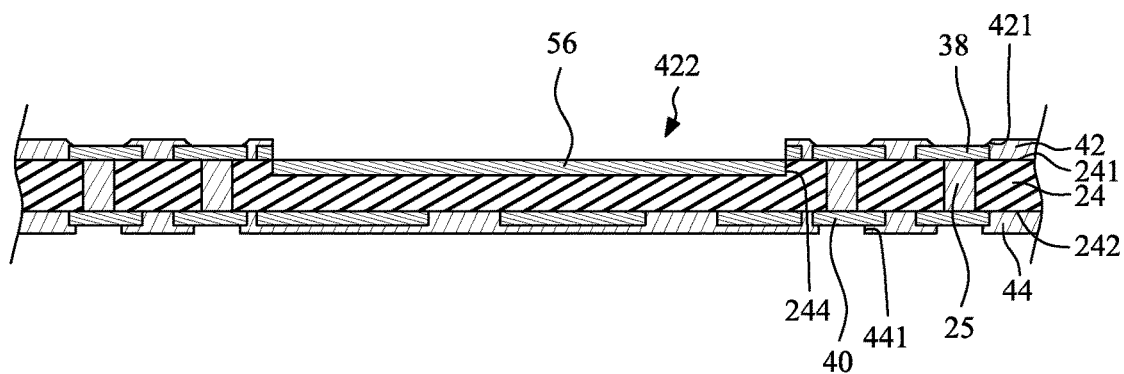
FIG. 14 illustrates one or more stages of an example of a method for manufacturing a semiconductor package structure according to some embodiments of the present disclosure.

Referring to FIG. 14, a first protection layer 42 is formed on the first surface 241 of the second substrate 24 to cover the first patterned circuit layer 38. The first protection layer 42 defines a plurality of first openings 421 to expose at least portions of the first patterned circuit layer 38. In addition, the first protection layer 42 further defines a central opening 422 to expose the protrusion portion 56. A second protection layer 44 is formed on the second surface 242 of the second substrate 24 to cover the second patterned circuit layer 40. The second protection layer 44 defines a plurality of second openings 441 to expose portions of the second patterned circuit layer 40. The first protection layer 42 and the second protection layer 44 may be, e.g., solder resist layers.

Figure 15:
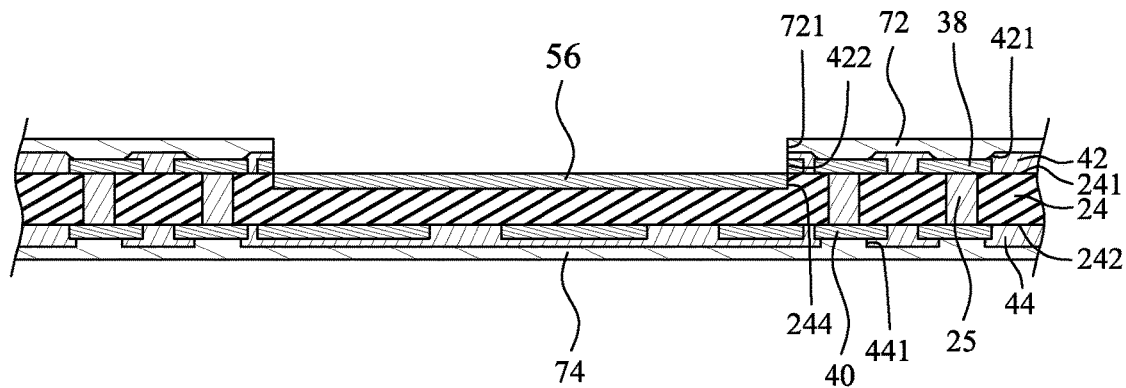
FIG. 15 illustrates one or more stages of an example of a method for manufacturing a semiconductor package structure according to some embodiments of the present disclosure.

Referring to FIG. 15, a third photoresist layer 72 and a fourth photoresist layer 74 are formed by, for example, coating. The third photoresist layer 72 covers the first protection layer 42 and the exposed first patterned circuit layer 38, and defines a central opening 721 corresponding to the central opening 422 of the first protection layer 42 to expose the protrusion portion 56. The fourth photoresist layer 74 covers the second protection layer 44 and the exposed second patterned circuit layer 40. The third photoresist layer 72 and the fourth photoresist layer 74 may be made of, e.g., a photo-imageable material.

Figure 16:
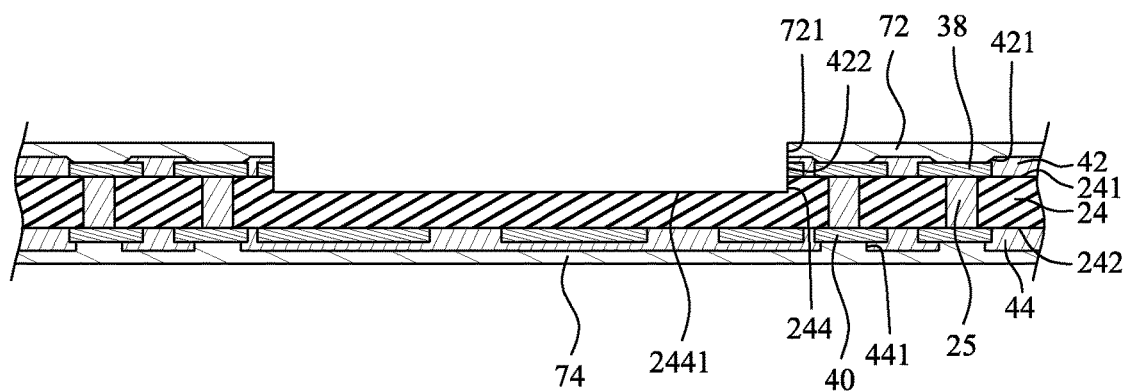
FIG. 16 illustrates one or more stages of an example of a method for manufacturing a semiconductor package structure according to some embodiments of the present disclosure.

Referring to FIG. 16, an etching process is performed on the protrusion portion 56, with the third photoresist layer 72 serving as a mask. Thus, the protrusion portion 56 is removed by, e.g., etching. Meanwhile, a bottom surface 2441 of the cavity 244 of the second substrate 24 is exposed.

Figure 17:
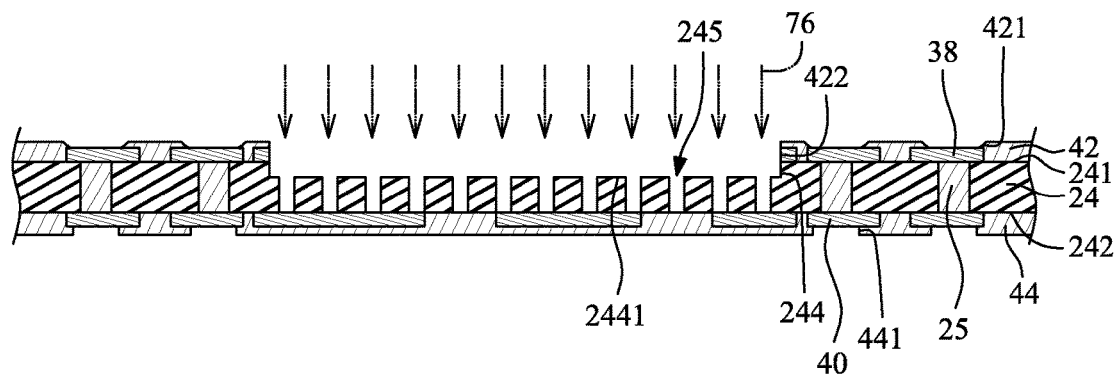
FIG. 17 illustrates one or more stages of an example of a method for manufacturing a semiconductor package structure according to some embodiments of the present disclosure.

Referring to FIG. 17, the third photoresist layer 72 and the fourth photoresist layer 74 are removed by, for example, stripping. Laser beams 76 are applied to the bottom surface 2441 of the cavity 244 of the second substrate 24 so as to form a plurality of through holes 245 that are in communication with the cavity 244.

Figure 18:
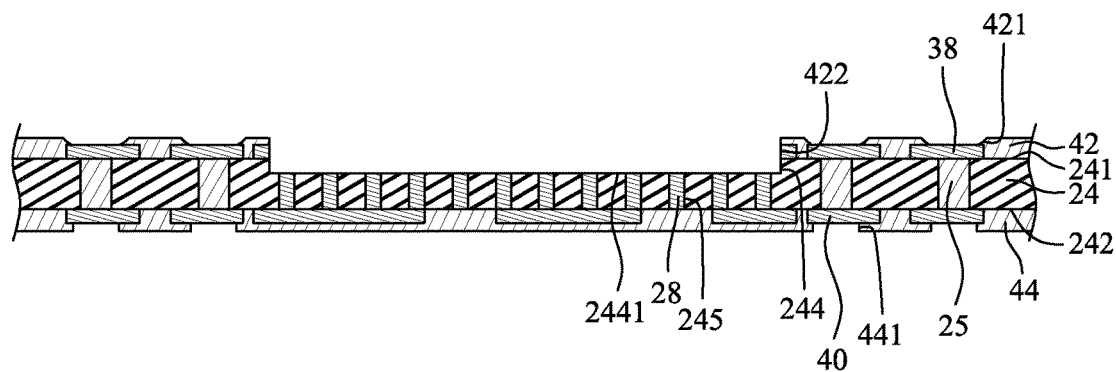
FIG. 18 illustrates one or more stages of an example of a method for manufacturing a semiconductor package structure according to some embodiments of the present disclosure.

Referring to FIG. 18, the through holes 245 are filled with a thermal paste (e.g., copper paste) so as to form a plurality of thermal vias 28. The thermal vias 28 extend through the second substrate 24 and are disposed corresponding to (e.g., under) the cavity 244. That is, the thermal vias 28 are disposed in the through holes 245 that are in communication with the cavity 244. A top end of each of the thermal vias 28 is disposed adjacent to or exposed in the cavity 244 (e.g., exposed from the bottom surface 2441 of the cavity 244), whereas a bottom end of each of the thermal vias 28 is disposed adjacent to or exposed from the second surface 242 of the second substrate 24. In some embodiments, the thermal vias 28 may contact a portion of the second patterned circuit layer 40. A length of each of the thermal vias 28 is less than a length of each of the conductive vias 25. The thermal vias 28 may be used as heat dissipation paths; however, the thermal vias 28 can be used, alternatively or additionally, as electrical connection paths.

Figure 19:
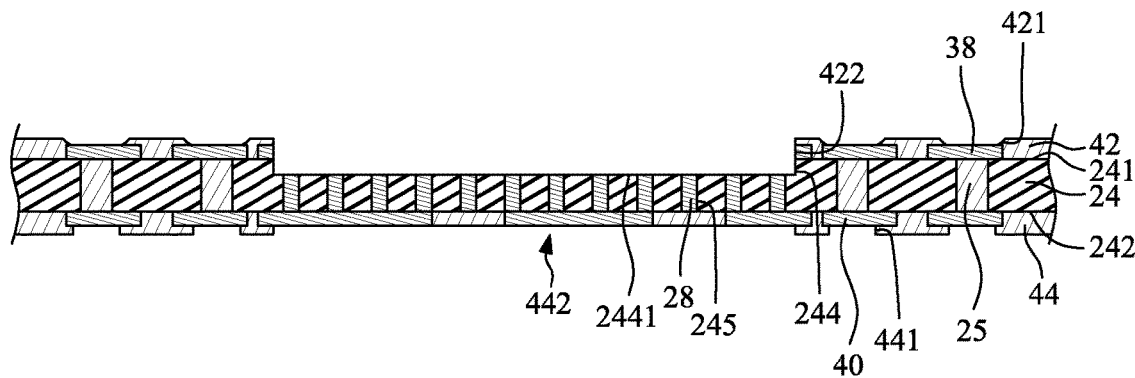
FIG. 19 illustrates one or more stages of an example of a method for manufacturing a semiconductor package structure according to some embodiments of the present disclosure.

Referring to FIG. 19, a central opening 442 is formed in the second protection layer 44 to expose the second patterned circuit layer 40 that is connected to the thermal vias 28. That is, the central opening 442 of the second protection layer 44 is disposed under the cavity 244.

Figure 20:
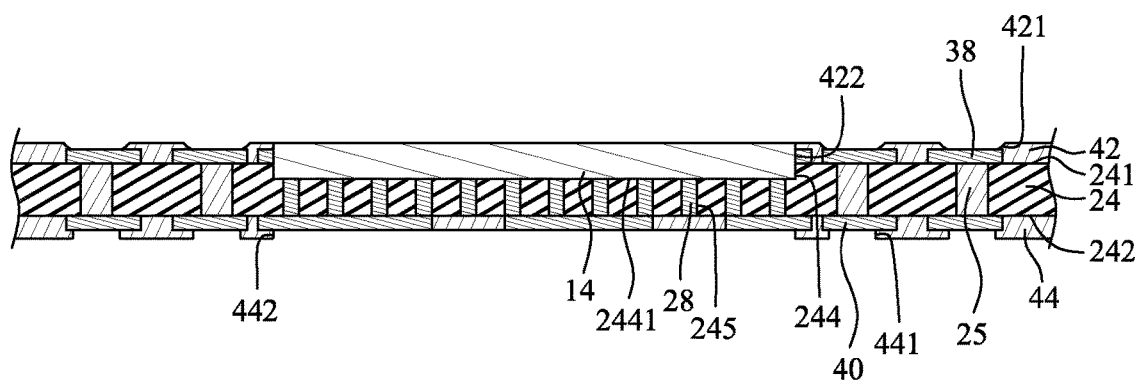
FIG. 20 illustrates one or more stages of an example of a method for manufacturing a semiconductor package structure according to some embodiments of the present disclosure.

Referring to FIG. 20, a thermal conductive material 14 is formed or disposed in the cavity 244 of the second substrate 24 to contact the thermal vias 28. The thermal conductive material 14 may be a paste type, and may include one or more copper fillers. The thermal conductive material 14 may be a TIM with a thermal conductivity of greater than or equal to 3 W/mK, about 4 W/mK, or about 5 W/mK.

Figure 21:
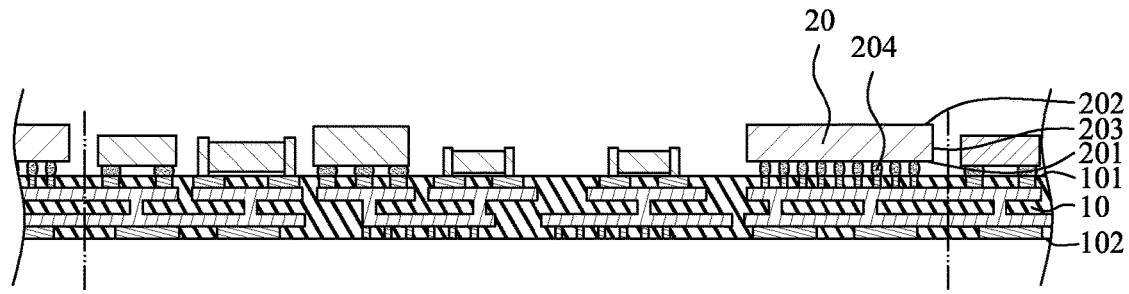
FIG. 21 illustrates one or more stages of an example of a method for manufacturing a semiconductor package structure according to some embodiments of the present disclosure.

Referring to FIG. 21, a first substrate 10 is provided. In some embodiments, the first substrate 10 can be similar to, or substantially the same as, the first substrate 10 illustrated in FIG. 3, except that the first substrate 10 of FIG. 21 can be a strip type substrate structure or a panel type substrate structure. The first substrate 10 can be a package substrate, and can have a first surface 101 and a second surface 102 opposite to the first surface 101. The material of the first substrate 10 may be organic or inorganic. For example, the material of the first substrate 10 may include a glass-reinforced epoxy resin material (e.g., FR4), BT, epoxy, silicon, PCB material, glass, ceramic, or a combination of two or more thereof.

At least one second semiconductor element 20 is attached or mounted to and electrically connected to the first surface 101 of the first substrate 10. In some embodiments, the second semiconductor element 20 may include at least one semiconductor die (e.g., a Wi-Fi module) and/or at least one passive element. The second semiconductor element 20 has a first surface 201 (e.g., an active surface), a second surface 202 (e.g., a back side surface) and a side surface 203. The second surface 202 is opposite to the first surface 201, and the side surface 203 extends between the first surface 201 and the second surface 202. The first surface 201 of the second semiconductor element 20 faces the first surface 101 of the first substrate 10, and is electrically connected to the first surface 101 of the first substrate 10 through a plurality of second interconnection elements 204, such as bumps or pillars or both. For example, the second semiconductor element 20 may be attached to the first surface 101 of the first substrate 10 by flip chip bonding.

Figure 22:
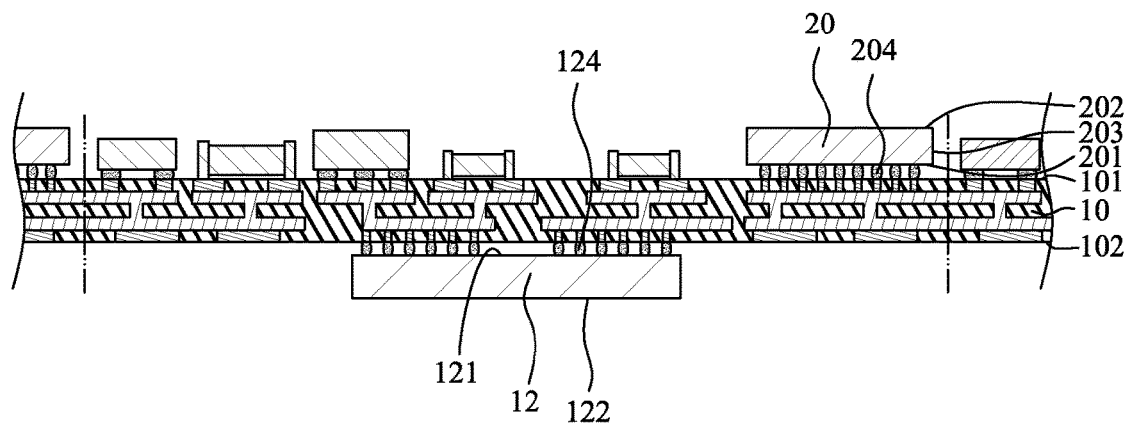
FIG. 22 illustrates one or more stages of an example of a method for manufacturing a semiconductor package structure according to some embodiments of the present disclosure.

Referring to FIG. 22, at least one first semiconductor element 12 is attached or mounted to and electrically connected to the second surface 102 of the first substrate 10. The first surface 121 of the first semiconductor element 12 faces the second surface 102 of the first substrate 10, and is electrically connected to the second surface 102 of the first substrate 10 through the first interconnection elements 124. For example, the first semiconductor element 12 may be attached to the second surface 102 of the first substrate 10 by flip chip bonding.

Figure 23:
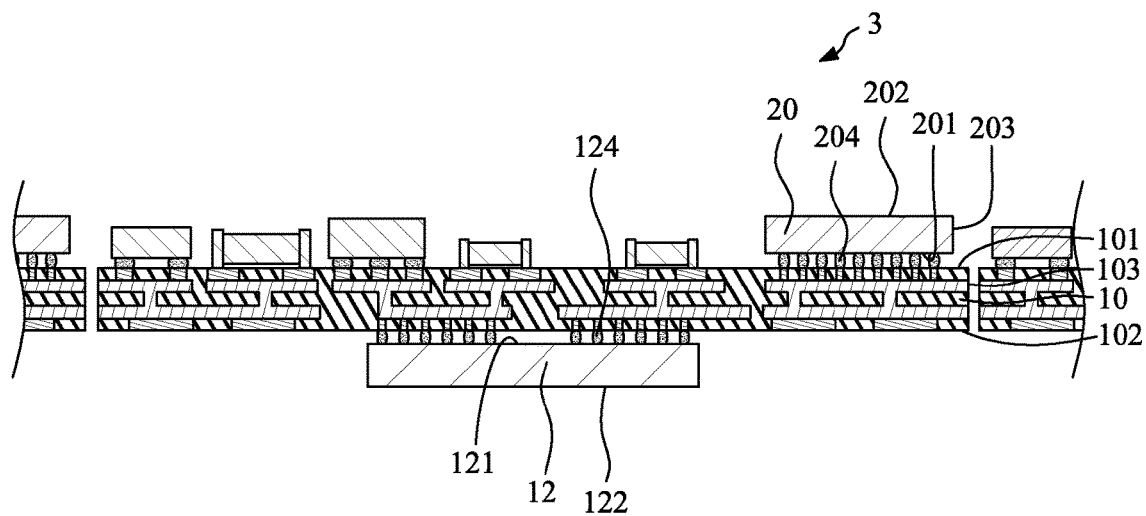
FIG. 23 illustrates one or more stages of an example of a method for manufacturing a semiconductor package structure according to some embodiments of the present disclosure.

Referring to FIG. 23, the first substrate 10 is singulated by cutting or sawing so as to form a plurality of semiconductor modules 3. Meanwhile, the first substrate 10 of a semiconductor module 3 has a periphery surface 103 extending between the first surface 101 and the second surface 102.

Figure 24:
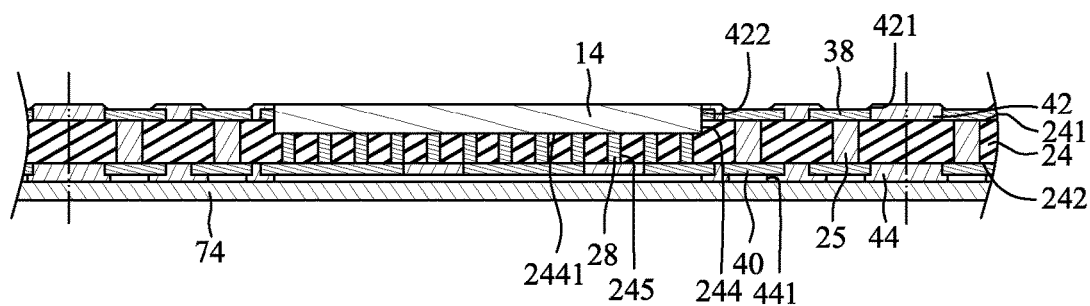
FIG. 24 illustrates one or more stages of an example of a method for manufacturing a semiconductor package structure according to some embodiments of the present disclosure.

Referring to FIG. 24, the second substrate 24 of FIG. 20 is attached to a tape 74. The second protection layer 44 contacts the tape 74, and the cavity 244 of the second substrate 24 faces upward.

Figure 25:
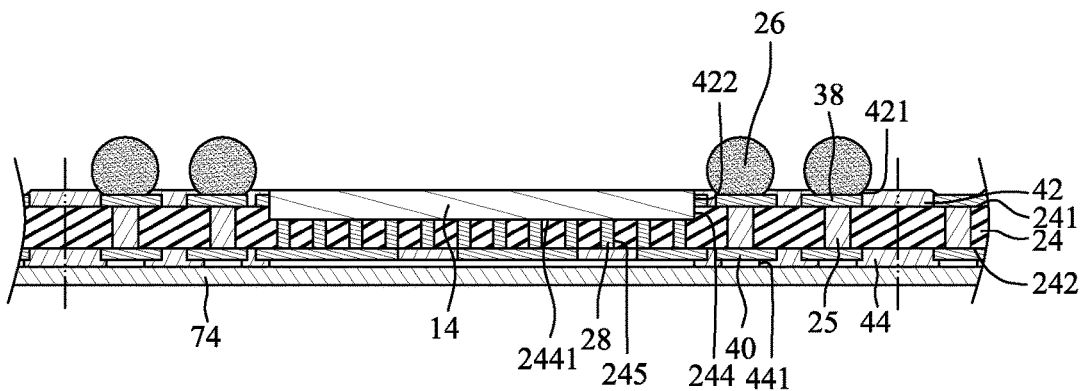
FIG. 25 illustrates one or more stages of an example of a method for manufacturing a semiconductor package structure according to some embodiments of the present disclosure.

Referring to FIG. 25, the first electrical connectors 26 are formed or disposed on the first patterned circuit layer 38 exposed in the first openings 421 of the first protection layer 42. Thus, the first electrical connectors 26 are electrically connected to the conductive vias 25. The first electrical connectors 26 may be, e.g., solder balls. In some embodiments, the first patterned circuit layer 38 and the first protection layer 42 may be omitted, and the first electrical connectors 26 are formed or disposed directly on the top end of respective one of the conductive vias 25.

Figure 26:
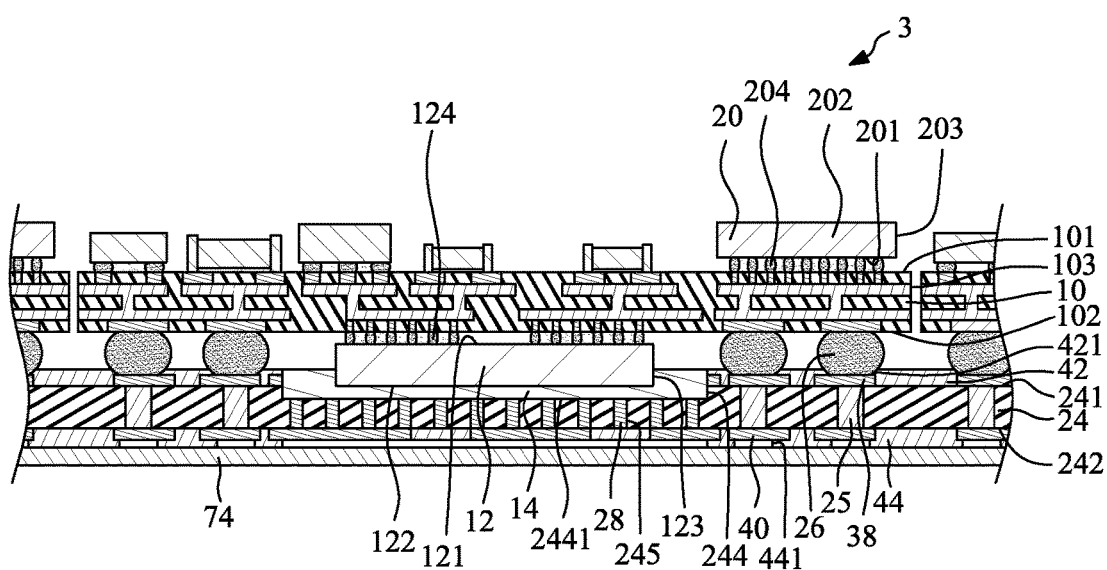
FIG. 26 illustrates one or more stages of an example of a method for manufacturing a semiconductor package structure according to some embodiments of the present disclosure.

Referring to FIG. 26, the semiconductor modules 3 are attached to the second substrate 24. Thus, the first substrate 10 is bonded to the second substrate 24 through the first electrical connectors 26. The first surface 241 and the cavity 244 of the second substrate 24 faces the second surface 102 of the first substrate 10. As shown in FIG. 26, the first surface 241 of the second substrate 24 is electrically connected to the second surface 102 of the first substrate 10 through the first electrical connectors 26. The cavity 244 is used for accommodating the first semiconductor element 12. That is, the first semiconductor element 12 is located within the cavity 244 of the second substrate 24, and is thermally connected to the thermal vias 28 through the thermal conductive material 14. The thermal conductive material 14 may be used as a buffer layer to prevent the first semiconductor element 12 from cracking.

In some embodiments, the thermal conductive material 14 may be omitted, thus, the second surface 122 of the first semiconductor element 12 directly contacts the bottom surface 2441 of the cavity 244. That is, the second surface 122 of the first semiconductor element 12 directly contacts the top ends of the thermal vias 28 directly, as shown in FIG. 1.

Figure 27:
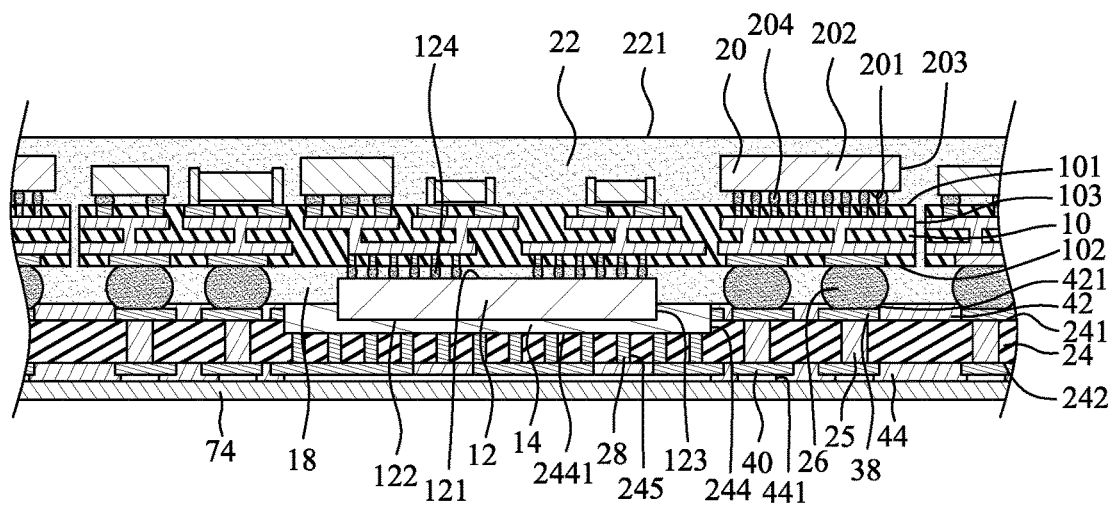
FIG. 27 illustrates one or more stages of an example of a method for manufacturing a semiconductor package structure according to some embodiments of the present disclosure.

Referring to FIG. 27, a first encapsulant 18 and a second encapsulant 22 are formed on the first surface 101 and the second surface 102 of the first substrate 10, respectively. In some embodiments, the first encapsulant 18 and the second encapsulant 22 may be formed concurrently through a gap between two first substrates 10 during one stage, which is referred to as "double side molding." As shown in FIG. 27, the first encapsulant 18 is formed or disposed to fill a gap between the second surface 102 of the first substrate 10 and the first surface 241 of the second substrate 24, and extends into and fills the cavity 244 of the second substrate 24. Thus, the first encapsulant 18 covers the side surface 123 of the first semiconductor element 12, and further covers the electrical connectors 26. The material of the first encapsulant 18 may be, e.g., a molding compound. In addition, a portion of the first encapsulant 18 may surround and protect the first interconnection elements 124 (e.g., a MUF). In some embodiments, there may be an underfill disposed in the space between the first semiconductor element 12 and the second surface 102 of the first substrate 10 to surround and protect the first interconnection elements 124.

As shown in FIG. 27, the second encapsulant 22 covers the second semiconductor element 20. The material of the second encapsulant 22 may be, e.g., a molding compound. The second encapsulant 22 has a first surface 221. The first surface 221 of the second encapsulant 22 is higher than the second surface 202 of the second semiconductor element 20. In addition, a portion of the second encapsulant 22 may further extend into the space between the second semiconductor element 20 and the first surface 101 of the first substrate 10 to surround and protect the second interconnection elements 204 (e.g., a MUF). In some embodiments, there may be an underfill disposed in the space between the second semiconductor element 20 and the first surface 101 of the first substrate 10 to surround and protect the second interconnection elements 204.

Figure 28:
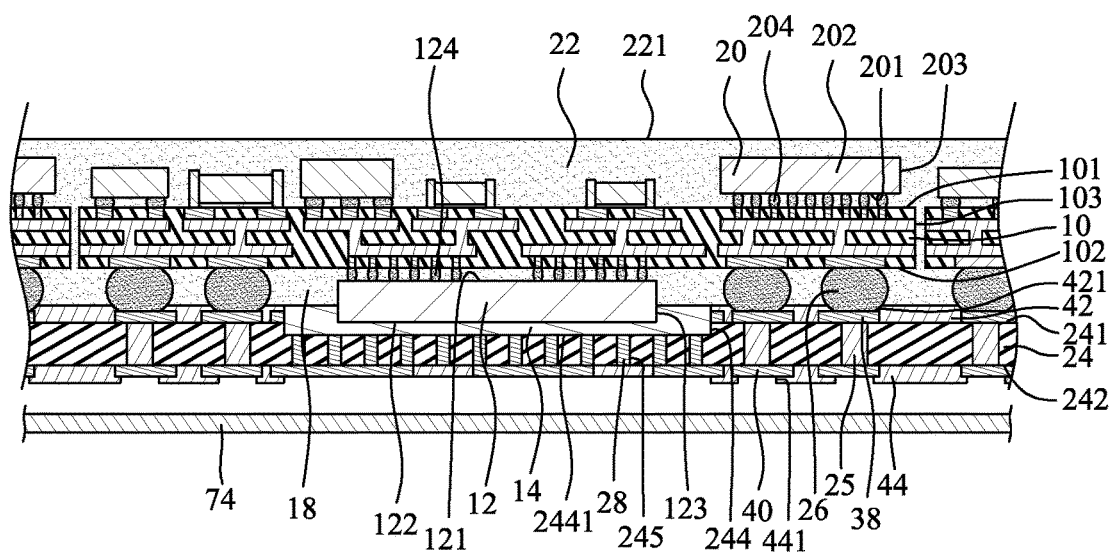
FIG. 28 illustrates one or more stages of an example of a method for manufacturing a semiconductor package structure according to some embodiments of the present disclosure.

Referring to FIG. 28, the tape 74 is removed from the second substrate 24.

Figure 29:
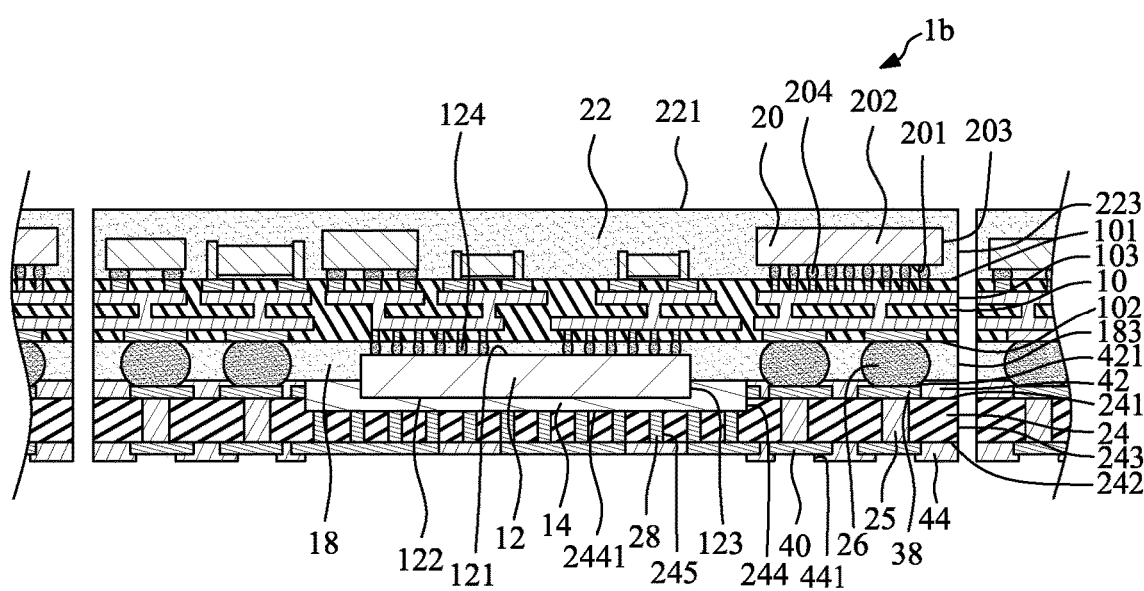
FIG. 29 illustrates one or more stages of an example of a method for manufacturing a semiconductor package structure according to some embodiments of the present disclosure.

Referring to FIG. 29, a singulation process is conducted so as to obtain a plurality of individual semiconductor package structures 1b as shown in FIG. 3. After the singulation process, the second encapsulant 22 has a periphery surface 223, the first encapsulant 18 has a periphery surface 183, and the second substrate 24 has a periphery surface 243. The periphery surface 223 of the second encapsulant 22, the periphery surface 103 of the first substrate 10, the periphery surface 183 of the first encapsulant 18 and the periphery surface 243 of the second substrate 24 may be substantially coplanar with each other.

In some embodiments, a shielding layer 30 (FIG. 3) is further formed on the periphery surface 223 of the second encapsulant 22, the periphery surface 103 of the first substrate 10, the periphery surface 183 of the first encapsulant 18 and the periphery surface 243 of the second substrate 24. The shielding layer 30 may include at least one metal layer and may be formed by plating or sputtering.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be substantially equal to a second numerical value if the first numerical value lies within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

In the description of some embodiments, a component provided "on" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first substrate;
   at least one first semiconductor element attached to the first substrate; and
   a second substrate defining a cavity and including a plurality of thermal vias, a plurality of conductive vias and a main body;
   wherein each of the conductive vias is longer than each of the thermal vias, the main body is disposed between adjacent two of the thermal vias and between adjacent two of the conductive vias, the main body is a monolithic structure, and one end of each of the thermal vias is exposed in the cavity, and the first semiconductor element is disposed within the cavity and contacts the thermal vias.

2. The semiconductor package structure according to claim 1, further comprising a plurality of first electrical connectors disposed between the first substrate and the second substrate and electrically connecting the first substrate and the second substrate.

3. The semiconductor package structure according to claim 2, wherein a sum of a height of one of the first electrical connectors and a maximum thickness of the second substrate is substantially equal to a sum of a thickness of the first semiconductor element and a length of one of the thermal vias.

4. The semiconductor package structure according to claim 1, wherein the second substrate further includes a patterned circuit layer contacting at least one of the thermal vias.

5. The semiconductor package structure according to claim 1, wherein the first substrate has a first surface and a second surface opposite to the first surface, the first semiconductor element is attached to the second surface of the first substrate, the cavity of the second substrate faces the second surface of the first substrate, and the semiconductor package structure further comprises at least one second semiconductor element attached to the first surface of the first substrate.

6. The semiconductor package structure according to claim 5, further comprising:
a first encapsulant filling a gap between the first substrate and the second substrate and covering a side surface of the first semiconductor element; and
a second encapsulant disposed on the first surface of the first substrate and covering the second semiconductor element.

7. The semiconductor package structure according to claim 6, further comprising a shielding layer disposed on a periphery surface of the second encapsulant, a periphery surface of the first substrate, a periphery surface of the first encapsulant and a periphery surface of the second substrate.

8. The semiconductor package structure according to claim 1, further comprising a plurality of interconnection elements, the first semiconductor element electrically connecting to the first substrate through the interconnection elements.

9. A semiconductor package structure, comprising:
a first substrate;
at least one first semiconductor element attached to the first substrate;
a second substrate defining a cavity and including a plurality of thermal vias, a plurality of conductive vias and a main body; wherein each of the conductive vias is longer than each of the thermal vias, the main body is disposed between adjacent two of the thermal vias and between adjacent two of the conductive vias, the main body is a monolithic structure, one end of each of the thermal vias is exposed in the cavity, and the first semiconductor element is disposed within the cavity; and
a thermal conductive material interposed between the first semiconductor element and the thermal vias.

10. The semiconductor package structure according to claim 9, wherein each of the thermal vias includes a top end and a bottom end, the top end of the thermal via is exposed in the cavity, and the bottom end of the thermal via is exposed from a surface of the second substrate.

11. The semiconductor package structure according to claim 9, wherein the thermal conductive material includes copper fillers.

12. The semiconductor package structure according to claim 9, wherein the thermal conductive material is interposed between a surface of the first semiconductor element and a bottom surface of the cavity.

13. The semiconductor package structure according to claim 9, wherein the first substrate has a first surface and a second surface opposite to the first surface, the first semiconductor element is attached to the second surface of the first substrate, the cavity of the second substrate faces the second surface of the first substrate, and the semiconductor package structure further comprises at least one second semiconductor element attached to the first surface of the first substrate.

14. The semiconductor package structure according to claim 13, further comprising:
a first encapsulant filling a gap between the first substrate and the second substrate; and
a second encapsulant disposed on the first surface of the first substrate and covering the second semiconductor element.

15. The semiconductor package structure according to claim 9, further comprising a thermal connector thermally connected to at least one of the thermal vias.

16. The semiconductor package structure according to claim 15, further comprising a circuit board, wherein the second substrate is thermally connected to the circuit board through the thermal connector.

17. The semiconductor package structure according to claim 16, further comprising a plurality of second electrical connectors disposed between the second substrate and the circuit board and electrically connecting the second substrate and the circuit board.

18. The semiconductor package structure according to claim 9, further comprising a plurality of interconnection elements, the first semiconductor element electrically connecting to the first substrate through the interconnection elements.

19. A semiconductor package structure, comprising:
a first substrate;
at least one first semiconductor element attached to the first substrate;
a second substrate defining a cavity and including a plurality of thermal vias, a plurality of conductive vias and a main body; wherein each of the conductive vias is longer than each of the thermal vias, the main body is disposed between adjacent two of the thermal vias and between adjacent two of the conductive vias, the main body is a monolithic structure, one end of each of the thermal vias is exposed in the cavity, and the first semiconductor element is disposed within the cavity and is thermally connected to the thermal vias;
a plurality of first electrical connectors disposed between the first substrate and the second substrate for electrically connecting the first substrate and the second substrate; and
a first encapsulant filling a gap between the first substrate and the second substrate and covering the first electrical connectors.

20. The semiconductor package structure according to claim 19, wherein the first encapsulant further covers a side surface of the first semiconductor element.

21. The semiconductor package structure according to claim 19, further comprising a thermal conductive material interposed between the first semiconductor element and the thermal vias.

22. A method for manufacturing a semiconductor package structure, comprising:

(a) attaching at least one first semiconductor element to a first substrate;
(b) providing a second substrate defining a cavity and including a plurality of thermal vias, a plurality of conductive vias and a main body; wherein each of the conductive vias is longer than each of the thermal vias, the main body is disposed between adjacent two of the thermal vias and between adjacent two of the conductive vias, the main body is a monolithic structure, and one end of each of the thermal vias is exposed in the cavity;
(c) bonding the first substrate and the second substrate, wherein the first semiconductor element is disposed within the cavity and is thermally connected to the thermal vias; and
(d) forming a first encapsulant to fill a gap between the first substrate and the second substrate.

23. The method according to claim 22, wherein (b) includes:
(b1) providing the second substrate defining the cavity;
(b2) forming a plurality of through holes that are in communication with the cavity; and
(b3) filling the through holes with a thermal paste and forming the thermal vias, wherein one end of each of the thermal vias is exposed in the cavity.

24. The method according to claim 22, wherein (b) includes:
(b1) providing a carrier having a protrusion portion;
(b2) pressing the second substrate against the protrusion portion on the carrier so that the second substrate defines the cavity corresponding to the protrusion portion;
(b3) removing the carrier including the protrusion portion; and
(b4) forming the thermal vias in the second substrate, wherein one end of each of the thermal vias is exposed in the cavity.

25. The method according to claim 24, wherein in (b1), the protrusion portion is formed by plating.

26. The method according to claim 24, wherein in (b3), the protrusion portion is removed by etching.

27. The method according to claim 22, wherein after (b) the method further comprises:
(b1) disposing a thermal conductive material in the cavity of the second substrate and contacting the thermal vias;
wherein in (c), the first semiconductor element is thermally connected to the thermal vias through the thermal conductive material.

28. The method according to claim 22, further comprising:
(e) forming a shielding layer on a periphery surface of the first substrate, a periphery surface of the first encapsulant and a periphery surface of the second substrate.

29. The method according to claim 22, wherein the first substrate has a first surface and a second surface opposite to the first surface, the first semiconductor element is attached to the second surface of the first substrate, and the cavity of the second substrate faces the second surface of the first substrate; wherein the method further comprises: attaching at least one second semiconductor element to the first surface of the first substrate.

30. The method according to claim 29, wherein (d) includes forming the first encapsulant to fill the gap between the first substrate and the second substrate and forming a second encapsulant covering the at least one second semiconductor element by double side molding.

* * * * *